Aug. 21, 1956 E. KEONJIAN 2,760,070
AMPLITUDE STABILIZED TRANSISTOR OSCILLATOR CIRCUIT
Filed Feb. 4, 1955
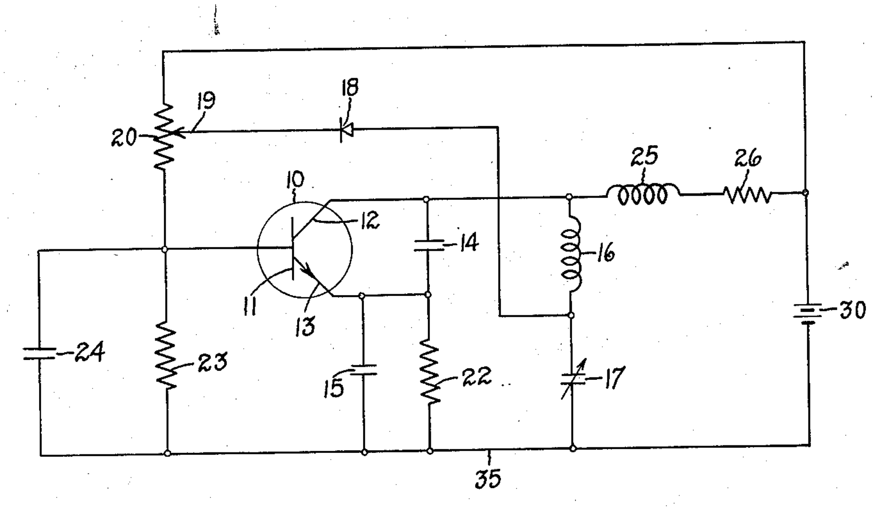
INVENTOR:
EDWARD KEONJIAN,
BY George V. Eltgroth
HIS ATTORNEY United States Patent Office 2,760,070
Patented Aug. 21, 1956

2,760,070

AMPLITUDE STABILIZED TRANSISTOR OSCILLATOR CIRCUIT

Edward Keonjian, Syracuse, N. Y., assignor to General Electric Company, a corporation of New York Application February 4, 1955, Serial No. 486,164

9 Claims. (Cl. 250—36)

This invention relates to transistor oscillator circuits and more particularly to amplitude stabilization of variable frequency transistor oscillator circuits.

The amplitude of oscillation of transistor oscillator circuits often varies considerably with a change in the frequency of oscillation. Due to frequency stability and distortion considerations, this undesirable effect must be eliminated by providing some form of amplitude stability for changes in frequency of oscillation.

One form of amplitude stabilization of a transistor oscillator is disclosed in "An Amplitude Stabilized Transistor Oscillator" by E. R. Kretzmer published in the Proceedings of the IRE February 1954, pages 391–401. Amplitude stabilization was obtained in a push-pull transistor oscillator by comparing the output voltage to a fixed reference voltage and feeding back the difference voltage in order to stabilize the amplitude of oscillation.

It is an object of the present invention to provide a new and improved transistor oscillator circuit which will maintain the amplitude of oscillation at a substantially constant value over a variable frequency range.

It is a further object of this invention to provide an amplitude stabilized transistor oscillator which eliminates the need for an auxiliary source of reference potential.

A still further object of the invention is to provide an amplitude stabilized transistor oscillator which is simple in construction and efficient in operation.

A further object of the invention is to provide a simplified amplitude stabilized transistor oscillator which requires fewer components than previously known devices.

These and other advantages of this invention will be more clearly understood from the following description taken in connection with the accompanying drawing, and the new and novel features that are considered characteristic of this invention will be set forth with particularity in the appended claims.

In the drawing, the circuit shown is a diagrammatic illustration of the invention.

The embodiment of the invention illustrated in the drawing uses a modified Colpitts oscillator circuit having an NPN junction type transistor 10. Collector electrode 12 and emitter electrode 13 of NPN junction transistor 10 are shunted by a capacitance 14. A capacitance 15 is connected between the emitter electrode 13 of transistor 10 and the common bus 35. An emitter biasing resistor 22 is connected to the emitter electrode 13 and to common bus 35. Series connected capacitors 14 and 15 are shunted by a series resonant circuit comprising inductance 16 and a variable capacitance 17. A biasing resistance 23 and a capacitor 24 are connected between the base electrode 11 and the common bus 35. A source of potential 30 is applied to the described circuit through resistance 26, a radio frequency choke coil 25 and through common bus 35. This circuit defines a modified Colpitts oscillator whose frequency of oscillation is determined primarily by the parameters of capacitors 14, 15 and 17 and by inductance 16. Capacitances 14 and 15 are selected to provide a large susceptance which will effectively mask the inherent inter-electrode capacities of transistor 10 thereby increasing the frequency stability of the transistor oscillator. When transistor 10 is biased to an active operating point, current appears in the resonant circuit formed by inductance 16 and capacitances 14, 15 and 17. Since the emitter-base junction of transistor 10 shunts a portion of this resonant circuit, an increase in collector current by positive feedback from the resonant circuit increases the emitter current of transistor 10. Thus, sustained oscillations occur due to the positive feedback current from the resonant circuit which increases the collector current of transistor 10 which in turn increases the emitter current of transistor 10. The frequency of oscillation in this circuit may be controlled by variable capacitance 17. Since variable capacitance 17 is in series with inductance 16, a variation in capacitance 17 will effectively increase or decrease the value of inductance presented by the branch including inductance 16. This provides a convenient frequency control means.

As the frequency of oscillation is varied by varying the capacitor 17, the amplitude of oscillation also varies. This undesirable effect produces frequency instability and distortion. A method of minimizing this effect was disclosed in the Kretzmer article previously cited. By this method, the amplitude of the output voltage of the oscillator was compared to that of a fixed reference potential and the difference voltage was fed back to control the base current which has approximately the same waveform as the output current of the transistor. Since the base current of a transistor bears a definite relationship to the collector and emitter currents of a transistor, the output current of the transistor can be effectively controlled by controlling the base current.

A novel application of these principles is used to produce a new and improved amplitude stabilized transistor oscillator. This is accomplished by connecting a potentiometer 20 to the base electrode of transistor 10 and to the positive terminal of the source of potential 30. A diode 18 is connected between inductance 16 and variable capacitance 17 and to the variable contact 19 of potentiometer 20. It should be noted that a substantially constant D. C. reference voltage is developed across variable capacitance 17 because of the application of source 30 through resistance 26, choke coil 25, and inductance 16 to variable capacitance 17. Diode 18 is biased to cut-off under static conditions by the proper setting of variable tap 19 on potentiometer 20. When oscillation begins, and the amplitude of oscillation appearing in the resonant circuit and thus across variable capacitance 17 exceeds the difference between the reference potential across variable capacitance 17 and the potential of variable contact 19, the diode is biased forwardly, and begins conducting. Conduction by diode 18 causes a current to flow through the lower portion of potentiometer 20. This current flow decreases the bias on base 11 on transistor 10, and thus decreases the emitter current which in turn decreases the collector and base currents. The reduction in base current reduces the output current. When the amplitude of the output current decreases to the value of the reference potential, the diode 18 is again biased to cut-off. Intermediate values of oscillation voltage change the conduction angle of current flow through the diode 18, permitting an increase in base current offsetting any reduction in the oscillation amplitude. Thus, an effective means is provided to stabilize the amplitude of oscillation even though the frequency of oscillation is changed. The cut-off voltage of diode 18 may be varied by varying the adjustable tap 19 of potentiometer 20.

In the circuit shown, choke coil 25 prevents A. C. signals from being applied to the D. C. source of potential 30. Resistance 26 provides a voltage drop to help maintain a substantially constant reference potential across variable capacitance 17. It also avoids parasitic oscillations which might arise due to the combination of inductance in radio frequency choke coil 25 and stray circuit capacity.

While it will be understood that the circuit specifications for the oscillator shown may vary according to the design or to any particular application, the following circuit parameters are included, by way of example only, as suitable for an amplitude stabilized output over the frequency range of one to two megacycles:

| | |
|---|---|
| Source **30** | 12 volts. |
| Capacitor **14** | 700 micromicrofarads. |
| Capacitor **15** | 1,000 micromicrofarads. |
| Inductance **16** | 120 microhenries. |
| Variable capacitance **17** | 120 micromicrofarads. |
| Potentiometer **20** | 100,000 ohms with tap set between 10,000 and 90,000 ohms. |
| Choke coil **25** | 40 millihenries. |
| Resistance **26** | 10,000 ohms. |
| Capacitance **24** | .01 microfarad. |
| Resistance **23** | 100,000 ohms. |
| Resistance **22** | 25,000 ohms. |

A circuit using the aforesaid circuit parameters reduced the amplitude variation of the oscillator output from 41.5% to 8.85% for a given tuning range. These results indicate the practicability of the illustrative example embodying the principles of this invention.

As will appear obvious to those skilled in the art, a PNP junction type transistor may be used with the described circuit by reversing the polarity of the supply source and diode 18.

Since other modifications and changes varied to fit particular operating requirements and environments will be apparent to those skilled in the art, the invention is not considered limited to the examples chosen for purposes of disclosure and covers all modifications which do not constitute departures from the true spirit and scope of this invention.

What I claim as new and desire to secure by Letters Patent of the United States is:

1. An oscillator of the character described comprising a transistor having base, emitter and collector electrodes, a parallel series resonant circuit having an inductance and a variable capacitance connected across a first and second capacitance, means connecting said first capacitance between the emitter and collector electrodes of said transistor, a source of potential, means applying said source of potential to said variable capacitance, a potentiometer having a variable tap, means connecting said potentiometer with the base electrode of said transistor and with said source of potential thereby providing said base electrode with a bias potential and control means connected between said adjustable tap and said source of reference potential for altering the bias on said base electrode.

2. An oscillator comprising a transistor having base, emitter and collector electrodes, a parallel, series resonant circuit having an inductance and a variable capacitance connected across a first and second capacitance, means connecting said first capacitance between the emitter and collector electrodes of said transistor, a source of potential, means for applying said source of potential to said variable capacitance thereby providing a source of reference potential, a potentiometer having a variable tap, means connecting said potentiometer with the base electrode of said transistor and with said source of potential thereby providing said base electrode with a bias potential and control means connected between said adjustable tap and said source of reference potential for altering the bias on said base electrode, and means whereby said control means operates when the magnitude of oscillation potential of said oscillator is greater than that of the reference potential.

3. An oscillator of the character described comprising a transistor having base, emitter and collector electrodes, a parallel, series resonant circuit having an inductance and a variable capacitance connected across a first and second capacitance, means connecting said first capacitance between the emitter and collector electrodes of said transistor, a source of potention, means for applying said source of potential across the inductance and said variable capacitance thereby providing a source of reference potential, a potentiometer having a variable tap, means linking said potentiometer with the base electrode of said transistor and with said source of potential to provide said base electrode with a bias potential, an asymmetrical control device, means connecting said device to said adjustable tap and to said source of reference potential for altering the bias on said base electrode, and means whereby said asymmetrical control device operates when the magnitude of the oscillation potential of said oscillator exceeds that of the said reference potential.

4. An oscillator of the character described comprising a transistor having base, emitter and collector electrodes, a parallel, series resonant circuit having an inductance and a variable capacitance connected across a first and second capacitance, means connecting said first capacitance between the emitter and collector electrodes of said transistor, a source of potential, means including said inductance for applying said source of potential across said variable capacitance to provide a constant reference source, a potentiometer having a variable tap, means linking said potentiometer with the base electrode of said transistor and with said source of potential thereby providing said base electrode with a bias potential, a diode, means connecting said diode between said adjustable tap and said reference source, and means whereby said diode begins conducting when the amplitude of oscillation of said oscillator increases to a value which exceeds that of said reference source.

5. An oscillator comprising a transistor having base, emitter and collector electrodes, a first reactance, means connecting said first reactance between the collector and emitter electrodes of said transistor, a common bus, means connecting said second reactance between the emitter electrode of said transistor and said common bus, a series resonant circuit having an inductance and a variable capacitance, means connecting said resonant circuit to the collector electrode of said transistor and to said common bus, a source of potential, means for applying said source of potential to said series resonant circuit whereby a reference potential is developed across said variable capacitance, a potentiometer having an adjustable tap, means connecting said potentiometer between said source of potential and the base electrode of said transistor, an asymmetrical conducting device, means connecting said asymmetrical conducting device to the adjustable tap of said potentiometer and to said variable capacitance, and means whereby said asymmetrical conducting device begins conducting when the amplitude of oscillation of said oscillator exceeds that of said reference potential.

6. An oscillator of the character described comprising a transistor having base, emitter and collector electrodes, a first capacitance, means connecting said first capacitance between the collector and emitter electrodes of said transistor, a common bus, means connecting said second capacitance between the emitter electrode of said transistor and said common bus, a series resonant circuit having an inductance and a variable capacitance, means linking said resonant circuit to the collector electrode of said transistor and to said common bus, a source of potential, means for applying said source of potential to said series resonant circuit whereby a reference potential is developed across the said variable capacitance, a potentiometer having an adjustable tap, means connecting said potentiometer between said source of potential and the base electrode of said transistor, a diode, means connecting said diode to the adjustable tap of said potentiometer and to said variable capacitance, and means whereby said diode begins conducting when the amplitude of oscillation of said oscillator exceeds that of said reference potential.

7. An oscillator comprising a transistor having base, emitter and collector electrodes, a first capacitance, means connecting said first capacitance between the collector and emitter electrodes of said transistor, a common bus, means connecting said second capacitance between the emitter electrode of said transistor and said common bus, a resistance connected between said emitter electrode and said common bus, a series resonant circuit having an inductance and a variable capacitance, means linking said resonant circuit to the collector electrode of said transistor and to said common bus, a source of potential, means for applying said source of potential to said series resonant circuit, a potentiometer having an adjustable tap, means connecting said potentiometer between said source of potential and the base electrode of said transistor, another capacitance and another resistance connected in parallel between said base electrode and said common bus, a diode, and means connecting said diode to the adjustable tap of said potentiometer and to said variable capacitance.

8. An oscillator of the character described comprising a transistor having base, emitter and collector electrodes, a first reactance, means connecting said first reactance between the collector and emitter electrodes of said transistor, a common bus, means connecting said second reactance between the emitter electrode of said transistor and said common bus, a series resonant circuit having an inductance and a variable capacitance, means connecting said resonant circuit to the collector electrode of said transistor and to said common bus, a source of potential, means for applying said source of potential to said series resonant circuit whereby a reference potential is developed across said variable capacitance, a control means, means connecting said control means to said source of potential and to said base electrode to provide said base electrode with a biasing potential, and means connected to said control means and to said variable capacitance to alter the bias potential on said base electrode when the amplitude of the output voltage of said oscillator is greater than the reference potential across said control means.

9. An amplitude stabilized transistor oscillator comprising a transistor having base, emitter and collector electrodes, first and second capacitances, a common bus, means connecting said first capacitance between the collector and emitter electrodes of said transistor, a resistance, means connecting said second capacitance and said resistance in parallel between said common bus and said emitter electrode, a series resonant circuit having an inductance and a variable capacitance, a choke coil, a second resistance and a source of potential, means connecting said source through said second resistance and said choke coil to said series resonant circuit and to said common bus, a potentiometer with an adjustable tap, means connecting said potentiometer between said source of potential and said base electrode, a third resistance, a third capacitance, means connecting said third resistance and capacitance in parallel to said base electrode and to said common bus, a diode, and means connecting said diode to the adjustable tap of said potentiometer and to said variable capacitance.

References Cited in the file of this patent

FOREIGN PATENTS 519,672 Great Britain ............ Apr. 3, 1940

OTHER REFERENCES

Article: "Junction Transistor Circuit Applications," by Sulzer, pages 170–173 of "Electronics" for August 1953.